United States Patent [19]

Linvill

[11] 4,379,697
[45] Apr. 12, 1983

[54] STIMULATOR ARRAY

[75] Inventor: John G. Linvill, Portola Valley, Calif.

[73] Assignee: Stanford University, Stanford, Calif.

[21] Appl. No.: 312,094

[22] Filed: Oct. 16, 1981

[51] Int. Cl.³ ............................................. G09B 21/00
[52] U.S. Cl. .................................... 434/114; 340/407
[58] Field of Search ........................ 434/114; 340/407

[56] References Cited

U.S. PATENT DOCUMENTS

| | | | |
|---|---|---|---|
| 3,229,387 | 1/1966 | Linvill | 434/114 |
| 3,866,020 | 2/1975 | Charlesworth | 434/114 |
| 4,283,178 | 8/1981 | Tetzlaff | 434/114 |

OTHER PUBLICATIONS

N.S.F. Grant Progress Report entitled "Integrated Electro-Mechanical Transducer Systems" Oct. 1980.
Draft of Article entitled "Cyclindrical PVF₂ Electro-Mechanical Transducers" by Dameron and Linvill, submitted to N.S.F. in a letter dated Oct. 1, 1980.
Final Report to the Small Business Innovation Search Program entitled "Investigation of PVF₂ as a Tactile Stimulator for the Opticon", dated Mar. 31, 1980.
Technical Report No. 4834-3 of the Integrated Circuits Laboratory, Stanford Electronics Laboratories, Stanford University, entitled "PVF₂ Models, Measurements, Device Ideas", by Linvill, Mar. 1978.
Reprint of article from Acoustical Imaging, vol. 8, pp. 387–394, entitled "A Polyvinylidene Fluoride Bow-Tie Imaging Element" by Dameron and Linvill, published 1980.

*Primary Examiner*—William H. Grieb
*Attorney, Agent, or Firm*—Philip M. Shaw, Jr.

[57] ABSTRACT

A tactile stimulator is disclosed which comprises a stack of planar sheets of a piezoelectric polymer material, which in the preferred embodiment is PVF₂. Each sheet has two opposed broad flat faces and at least one tactile surface at one longitudinal end. Separate electrodes cover portions of each flat face of the sheets in predetermined patterns. The electrodes from sheet to sheet are mirror images of the corresponding electrode patterns of the next adjacent sheet. Each of the sheets is polarized in the direction of its tactile end such that upon application of a voltage across the electrodes of that sheet, the sheet will longitudinally extend its tactile surface.

7 Claims, 5 Drawing Figures

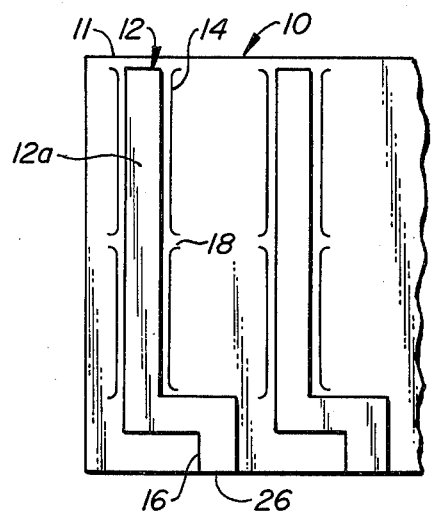
FIG._1.
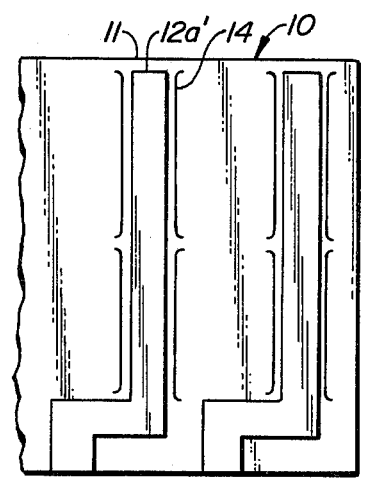
FIG._3.
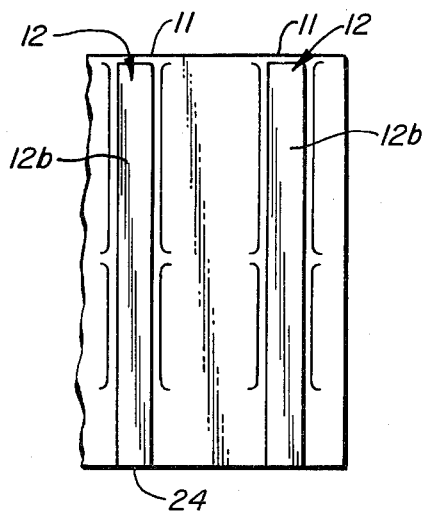
FIG._2.
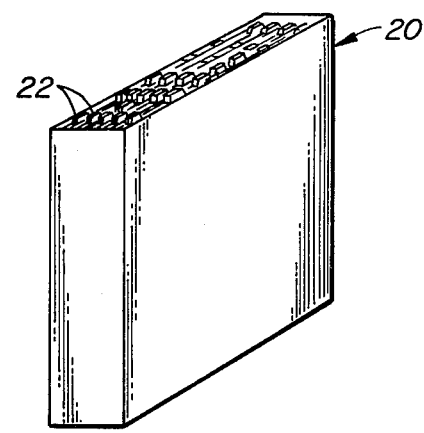
FIG._4.
FIG._5.

STIMULATOR ARRAY

BACKGROUND OF THE INVENTION

This invention relates to tactile stimulators and more particularly to a tactile stimulator for use in a photoelectronic reading device for the blind.

Several years ago the present inventor devised an optical to tactile converter device to allow blind people to read. This device converts printed or other optical text or material directly into a corresponding tactile image by means of an input silicon photo-camera which senses the imput image and produces a corresponding pattern of output signals which operate an electromechanical tactile stimulator. In the original device the tactile stimulator was comprised of ceramic bimorphs which vibrate pins in a two dimensional array to produce the output tactile image.

The tactile array produced using bimorphs is extremely expensive to assemble, is quite susceptible to damage in use, contributes significantly to the size, weight and cost of the reading instrument, and is noisy.

Various alternatives have been studied for the original bimorph array including the use of piezoelectric polymers, such as polyvinylidene fluoride ($PVF_2$). The first approach taken was to fabricate individual $PVF_2$ cylindrical tactile stimulators. This was found to be virtually unfeasible because of manufacturing difficulties in making electrode connections and in the signal strengths required to extend the cylinders.

SUMMARY OF THE INVENTION

The above and other disadvantages of prior art tactile stimulators are overcome by the present invention of a tactile stimulator comprising a stack of planar sheets of a piezoelectric polymer material, which in the preferred embodiment is $PVF_2$, with each sheet having two, opposed, broad, flat faces and at least one tactile surface at one longitudinal end. Separate electrodes cover portions of each flat face of the sheets in predetermined patterns. These electrodes from sheet to sheet are the mirror images of the corresponding electrode patterns of the next adjacent sheet. Each of the sheets is polarized in the direction of its tactile end such that upon application of a voltage of a predetermined magnitude and polarity from an external source across the electrodes of that sheet, the sheet will longitudinally extend its tactile surface.

In the preferred embodiment each sheet has a plurality of tactile surfaces at one longitudinal end and the electrode patterns on each sheet define a plurality of longitudinally extending fingers whose ends are coincident with the tactile surfaces. Each sheet is provided with a pattern of slit shaped perforations which outline the fingers to allow longitudinal extension relative to the other fingers on the same sheet when the predetermined voltage is applied to the corresponding electrodes of that finger.

The polarity of the sheets alternates from one sheet to the next. Means are provided for electrically connecting in parallel the mirror image electrodes of a predetermined number of fingers which are aligned in the direction of their thicknesses. Thus two combined, external electrodes are formed for a predetermined grouping of fingers so that upon the application of the voltage to the external electrodes the predetermined number of fingers will extend in unison as a column.

Because the electrode patterns can be produced by well-known photochemical processes of the type used in the semiconductor industry and because the perforations can be produced by laser cutting, the tactile array can be easily and cheaply fabricated.

The foregoing and other objects, features and advantages of the invention will be more readily understood upon consideration of the following detailed description of the preferred embodiment of the invention, when taken in conjunction with the accompanying drawings.

BRIEF DESCRIPTION OF THE DRAWING

FIG. 1 is a plan view, with portions broken away, of one of the layers of $PVF_2$ which makes up the stimulator array of invention illustrating the electrode pattern thereon;

FIG. 2 is a plan view showing the reverse side of the sheet shown in FIG. 1;

FIG. 3 is a plan view of the sheet which is located next adjacent to the sheet shown in FIG. 1 in the final stimulator array, illustrating the face which is opposite to the face of the sheet depicted in FIG. 1;

FIG. 4 is a prospective view of a tactile array according to the invention; and

FIG. 5 is a bottom view, with portions broken away, of the device depicted in FIG. 4.

DETAILED DESCRIPTION OF THE PREFERRED EMBODIMENT OF THE INVENTION

Referring now to the figures, sheet 10 is a piezoelectric polymer, preferably polyvinylidene fluoride ($PVF_2$).

The sheet 10 has planar surfaces which are provided with electrodes 12 deposited on opposite faces. These electrodes could be made of nickel or chromium material for example. The sheets 10 of $PVF_2$ will have been polarized so that a voltage of the proper polarity and magnitude impressed across the electrode faces 12 will cause extension of that portion of the sheet 10 which is between the electrodes 12 in the vertical direction, that is up, in the figures illustrated. As will be explained further herein, the upper edge of the portion of the sheet 10 which is between the electrodes 12, constitutes a tactile surface. The electrodes 12 are etched in defined configurations with mirror image patterns for opposing faces of adjacent sheets 10. In the preferred embodiment these electrode patterns are basically long strips which define longitudinally extending fingers whose ends stop just short of the tactile surfaces 11 of the sheets.

It will be noted that the particular electrode 12a, depicted in FIG. 1, has an L-shaped leg 16 at the bottom edge thereof whereas the electrode 12b on the opposite side of the sheet 10, as viewed in FIG. 2, is a straight column. The purpose of having mirror image patterns to the electrodes, for example 12a and 12a' is so that, when the sheets 10 are stacked together, electrodes having like polarity will be aligned with each other for purposes of connecting them to combined external contacts.

The electrode pattern is made by well-known etching techniques used in the semiconductor industry. It is to be noted that the electrodes 12 extend to the bottom edge of the sheet 10, as illustrated in the figures, for easy connection to combined, external contacts as will be explained in greater detail hereinafter in reference to FIG. 4.

Although in the figures the sheets 10 are etched clear of electrode material except where an electrode is desired, it will be appreciated that in other embodiments an isolation path need only be etched around each electrode to isolate it electrically from the rest of the electrode material on the sheet.

It is the property of the sheet material 10 that when a voltage of proper polarity and magnitude is provided between electrodes 12 on opposite sides of the sheet, the sheet will extend vertically, as described above. In order to allow the material beneath and between the electrodes 12 to extend, relative to the remainder of the sheet, cuts 14 are made on each side of the electrode portion 12 by means of a directed laser beam to permit motion of the stimulator portion of the sheet upward, as viewed in the drawings, relative to the body of the sheet. The laser cut pattern 14 is such that strips 18 of sheet material are left uncut. The width of the strips 18 should be small compared to the width of the electrode 12; i.e., on the order of one tenth of the electrode width. These strips 18 allow the sheet material beneath the electrodes 12 to be retained in position without unduly restraining their vertical extension.

A stimulator array 20 is made by stacking pairs of sheets 10 together so that the corresponding mirror image conductor areas are aligned with each other. When so assembled, a plurality of such sheet pairs are connected with the corresponding electrodes 12 in common to a plurality of external electrode pairs 24 and 26 to provide a plurality of stimulators 22. Each one of these stimulators 22 is comprised of the tactile surfaces 11 at the longitudinal ends of a pair of sheets 10 corresponding to the upper edges of the sheets 10 shown in FIGS. 1 through 3 and which underly and are between the electrodes 12. As shown in FIG. 5, electrode pairs 24 and 26 are derived by coupling together the bottom edges of corresponding electrodes 12 of the adjoining sheets making up the array. Alternatively a stimulator could employ more than one pair of sheets for each stimulator element. In such an embodiment terminals 24 and 26 would connect to a plurality of sheet pair electrodes. Unenergized spacers are placed between rows of spacers to provide proper dimensional spacing between the stimulator surfaces.

By way of example, a satisfactory array is comprised of $PVF_2$ sheets, 8 microns thick, having the electrode patterns shown in the figures. Each electrode finger 12 is 0.5 mm in width and 5 cm in length. Three pairs of sheets 10 are used to make one set of aligned stimulators, i.e. each stimulator 22 incorporates the tactile surfaces 11 of three pairs of sheet 10. By correct positioning of the electrodes 12 and the use of properly dimensioned spacers between every three pairs of sheets, the stimulators 22 are centered on 1 mm intervals over the width and depth of the end of the array 20. The spacers are made of $PVF_2$ or polytetrafluoroethylene. The strips 18 are 0.05 mm in width.

As mentioned above, the corresponding electrodes of the three pairs of sheets making up each stimulator are connected together to external contacts 24 and 26. A source of voltage of 100 volts D.C. gated at from 150–300 Hz will cause a sufficient vibratory extension of the tactile surfaces 11 that a normal person could feel it. It has been found that the human tactile sensitivity is greatest at this frequency range.

In the preferred embodiment, the array of sheets is surrounded by a box of similar plastic material to form a 1.5 cm by 3 cm by 5 cm case, for example.

The electronic input to the stimulator could be provided either by amplifying the output of a separate photoscanning diode array which is moved over the text to be read or, in the preferred embodiment, the photodiode array is attached to the bottom of the tactile stimulator so that there is a direct physical correspondence between the stimulation provided by the array and the text that is being read.

The terms and expressions which have been employed here are used as terms of description and not of limitation, and there is no intention, in the use of such terms and expressions, of excluding equivalents of the features shown and described, or portions thereof, it being recognized that various modifications are possible within the scope of the invention claimed.

What is claimed is:

1. Tactile stimulator apparatus comprising:
   a stack of planar sheets of a piezoelectric polymer material, each sheet having two, opposed, broad, flat faces and at least one tactile surface at one longitudinal end,
   separate electrodes covering portions of each flat face of the sheets in predetermined patterns which are mirror images of the corresponding electrode patterns of the next adjacent sheet face,
   and wherein each of said sheets is polarized in the direction of its tactile end such that upon application of a stimulating voltage of a predetermined magnitude and polarity from an external source across the electrodes of that sheet, the portion of the sheet between the electrodes will longitudinally extend its tactile surface.

2. Tactile stimulator apparatus, as recited in claim 1, further comprising means for connecting the corresponding electrodes of a plurality of the sheets in common such that the sheet portions between the electrodes will extend as a group upon application of a stimulating voltage from an external source.

3. Tactile stimulator apparatus, as recited in claim 1, wherein each sheet has a plurality of tactile surfaces at one longitudinal end; wherein the electrode patterns on each sheet define a plurality of longitudinally extending fingers whose ends are coincident with the tactile surfaces, and wherein each sheet is provided with a pattern of cuts which outline the fingers to allow longitudinal extension relative to other fingers on the same sheet when said predetermined voltage is applied to the corresponding electrodes of that finger.

4. Tactile stimulator apparatus, as recited in claim 3, wherein the fingers are parallel to each other.

5. Tactile stimulator apparatus as recited in claim 1 wherein the sheets are made of polyvinylidene fluoride ($PVF_2$).

6. Tactile stimulator apparatus, as recited in claim 3, further comprising means for electrically connecting in parallel the mirror image electrodes of a predetermined number of fingers which are aligned in the directions of their thicknesses, to form two combined electrodes, whereby, upon application of said voltage to the combined electrodes, the predetermined number of fingers will extend their tactile surfaces simultaneously.

7. Tactile stimulator apparatus as recited in claim 6 wherein the polarity of the sheets alternates from one sheet to the next.

* * * * *